United States Patent
Bauer et al.

(10) Patent No.: US 10,281,545 B2
(45) Date of Patent: May 7, 2019

(54) MAGNETIC RESONANCE APPARATUS AND OPERATING METHOD THEREFOR

(71) Applicant: Siemens Aktiengesellschaft, Munich (DE)

(72) Inventors: Simon Bauer, Baunach (DE); Bernd Kuehn, Uttenreuth (DE); Thomas Loeffler, Lauf a.d. Pegnitz (DE); Dominik Paul, Bubenreuth (DE); Daniel Nico Splitthoff, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 808 days.

(21) Appl. No.: 14/741,935

(22) Filed: Jun. 17, 2015

(65) Prior Publication Data

US 2015/0362573 A1 Dec. 17, 2015

(30) Foreign Application Priority Data

Jun. 17, 2014 (DE) .................. 10 2014 211 586

(51) Int. Cl.
*G01R 33/54* (2006.01)
*G01R 33/58* (2006.01)

(52) U.S. Cl.
CPC .......... *G01R 33/543* (2013.01); *G01R 33/58* (2013.01)

(58) Field of Classification Search
CPC .............. G01R 33/5608; G01R 33/543; G01R 33/385; G01R 33/5659; A61B 5/055
USPC ........................................................ 324/322
See application file for complete search history.

(56) References Cited

U.S. PATENT DOCUMENTS

| | | | | |
|---|---|---|---|---|
| 4,184,110 A | * | 1/1980 | Hinshaw | G01R 33/3621 324/300 |
| 4,604,579 A | * | 8/1986 | Cannon | G01R 33/50 324/309 |
| 4,698,593 A | * | 10/1987 | Crooks | G01R 33/50 324/309 |
| 5,519,320 A | | 5/1996 | Kanayama et al. | |
| 6,064,203 A | * | 5/2000 | Bottomley | G01R 33/50 324/307 |
| 6,160,398 A | * | 12/2000 | Walsh | G01R 33/3415 324/307 |
| 6,348,793 B1 | * | 2/2002 | Balloni | G06F 19/00 324/309 |
| 6,801,037 B1 | * | 10/2004 | Zhang | G01R 33/54 324/309 |

(Continued)

FOREIGN PATENT DOCUMENTS

JP H08336504 A 12/1996
JP 2006280820 A 10/2006

*Primary Examiner* — Christopher P McAndrew
(74) *Attorney, Agent, or Firm* — Schiff Hardin LLP

(57) ABSTRACT

In a magnetic resonance apparatus and an operating method therefore, a data acquisition sequence for operating the apparatus is repeatedly reviewed in a number of ascertainment passes executed in a processor, each ascertainment pass involving a calculation step, and in each calculation step a determination is made as to other respective values of data elements used in a previous calculation step have changed. If no change has occurred, a re-calculation in the current calculation step is not implemented, thereby reducing the time and computing capacity that are needed to generate a final data acquisition sequence.

7 Claims, 2 Drawing Sheets

(56) References Cited

U.S. PATENT DOCUMENTS

| | | | | |
|---|---|---|---|---|
| 7,081,750 B1* | 7/2006 | Zhang | ................... | G01R 33/54 |
| | | | | 324/309 |
| 7,443,166 B2* | 10/2008 | Heid | ...................... | G01R 33/54 |
| | | | | 324/307 |
| 7,782,056 B2* | 8/2010 | Noterdaeme | .... | G01R 33/56563 |
| | | | | 324/307 |
| 7,821,266 B2* | 10/2010 | Feiweier | ................ | G01R 33/54 |
| | | | | 324/309 |
| 7,902,821 B2* | 3/2011 | Nistler | ................ | G01R 33/246 |
| | | | | 324/307 |
| 8,742,756 B2* | 6/2014 | Wu | ........................ | A61B 5/055 |
| | | | | 324/307 |
| 8,754,645 B2* | 6/2014 | Gross | ..................... | G01R 33/50 |
| | | | | 324/307 |
| 9,606,205 B1* | 3/2017 | Ito | ...................... | G01R 33/4838 |
| 2005/0189940 A1* | 9/2005 | Feiweier | .............. | G01R 33/543 |
| | | | | 324/307 |
| 2006/0122490 A1* | 6/2006 | Sha | ........................ | A61B 5/055 |
| | | | | 600/413 |
| 2008/0036460 A1* | 2/2008 | He | .................... | G01R 33/5616 |
| | | | | 324/309 |
| 2008/0231270 A1* | 9/2008 | Fontius | ................ | G01R 33/288 |
| | | | | 324/307 |
| 2009/0033328 A1 | 2/2009 | Feiweier | | |
| 2010/0090694 A1* | 4/2010 | Heid | ..................... | A61B 5/055 |
| | | | | 324/309 |

* cited by examiner

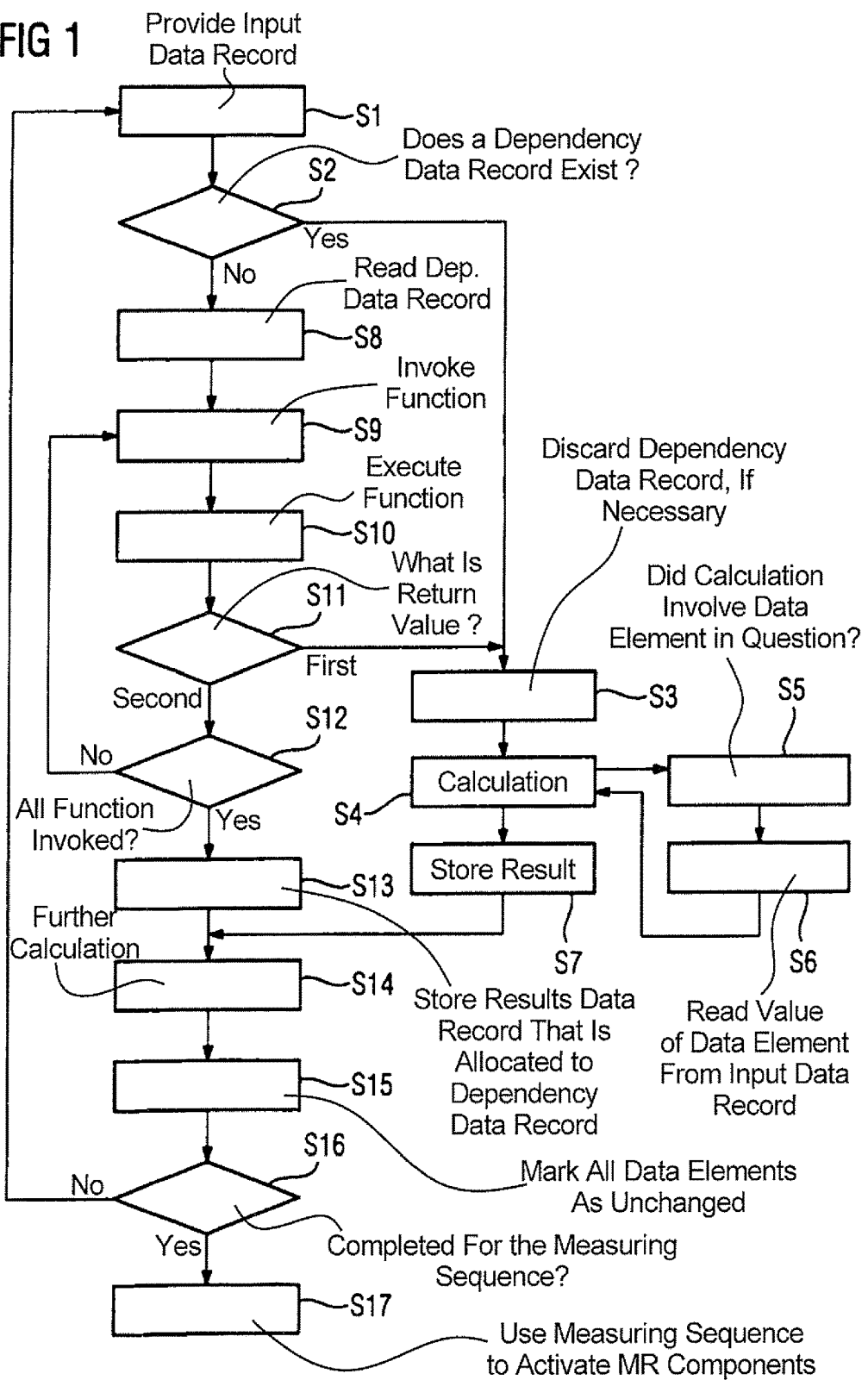

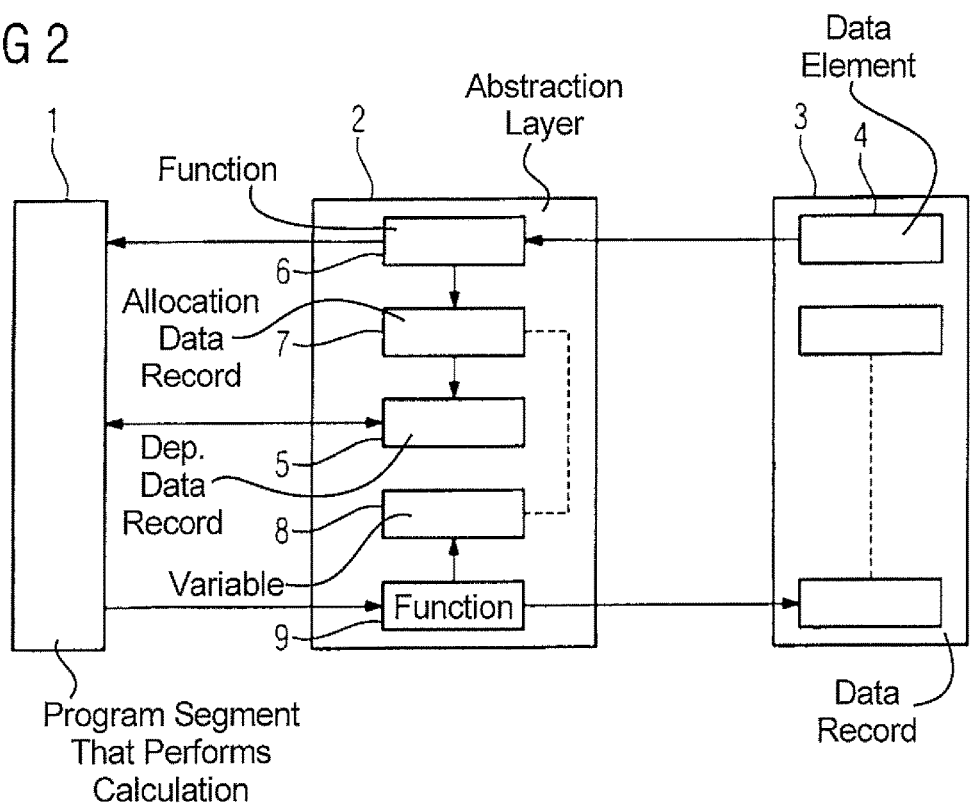
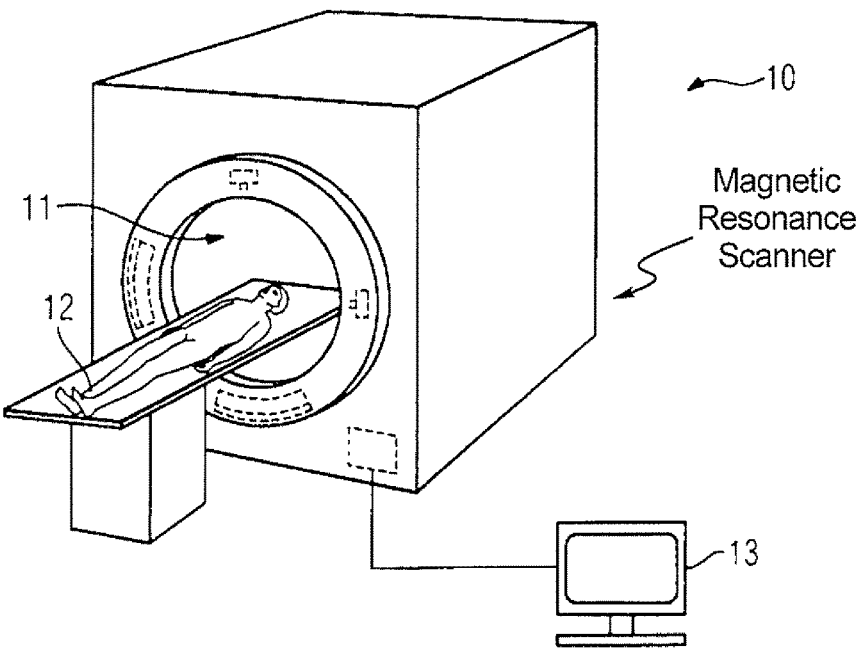

MAGNETIC RESONANCE APPARATUS AND OPERATING METHOD THEREFOR

BACKGROUND OF THE INVENTION

Field of the Invention

The invention concerns a method for operating a magnetic resonance apparatus, of the type wherein one measuring sequence is provided and/or checked in a number of ascertainment passes by an arithmetic device, dependent on at least one input data record having multiple data elements. The one measuring sequence including at least one control parameter for activating the magnetic resonance apparatus, wherein the value of at least one of the data elements varies between the ascertainment passes, and wherein at least one calculation step is performed to provide and/or check the measuring sequence. The invention also concerns a magnetic resonance device for implementing such a method.

Description of the Prior Art

Measuring (data acquisition) sequences for magnetic resonance apparatuses have a large number of parameters that determine the measuring protocol, and these parameters have a large number of mutual dependencies. High-quality measuring results are possible only in a fraction of the basically possible parameter space. Due to the complex connections between the individual measuring parameters, this part of the parameter space cannot be cohesively described. The parameter space can, moreover, be restricted by technical limitations of the magnetic resonance apparatus that is being used.

Even when changing an individual parameter of a measuring protocol, it may be necessary to adjust a number of different parameters of the measuring protocol in order to arrive at an executable sequence or a sequence with relatively high-quality measuring results. To assist users in the adjustment of measuring protocols, it is known to automatically ascertain individual parameters of the measuring protocol or to check a sequence, which has been parameterized by a user, as to its consistency. Provision and/or checking a measuring sequence for a magnetic resonance device requires numerous computationally complex calculation steps, however. Measuring protocols and the measuring sequences resulting therefrom are typically iteratively ascertained, which often requires a user has to specify and change parameters several times and, as a function of which a measuring sequence is provided or checked. The necessary calculations for the provision or checking of the measuring sequence can therefore lead to undesirable delays when using a magnetic resonance apparatus or in the sequence planning.

Although waiting times of this kind can be reduced by an increase in the computing power of the arithmetic processor of the magnetic resonance apparatus, the provision of increased computing power increases the costs for the magnetic resonance apparatus. Tight limits are set on the economically justifiable increase in the computing power.

SUMMARY OF THE INVENTION

An object of the present invention is therefore based on the object of disclosed a method for operating a magnetic resonance device which makes better use of existing computing capacities by increasing the efficiency of the provision and/or checking of a measuring sequence.

The object is achieved according to the invention by a method of the type initially described, but wherein, in each pass the calculation is made on the value of at least one of the data elements, and the calculation result is stored in a results data record allocated to the particular calculation step, and a dependency data record allocated to the results data record is ascertained that describes from which of the data elements the results data record was calculated, if either of the conditions is met, that (1) there is no dependency data record from the corresponding calculation step of one of the preceding ascertainment passes, or (2) for all results data records, at least one of the at least one data elements, on which the respective results data record depends, has a different value in the instantaneous calculation step than in the calculation step in which the respective results data record was ascertained. Otherwise the results data record, which was calculated solely as a function of data elements that have the same value in the instantaneous calculation step as in the calculation step in which the results data record was ascertained, is provided as the calculation result.

According to the invention, in at least one calculation step, the values of which of the data elements on which the calculation step depends are monitored, and the calculation is performed only if the value of at least one of these data elements has changed compared to the calculation step in which the corresponding dependency data record was ascertained. If the values of the data elements, on which the results data record of the respective calculation step is dependent, match the values at the instant at which the results data record was originally ascertained, the results data record can be re-used, so recalculation of the results data record is not necessary. Unnecessary multiple calculations are avoided and the efficiency of the provision or checking of the measuring sequence is increased by this approach.

Since in the inventive method an allocated dependency data record is also ascertained in the case of a recalculation of the results data record, it is not necessary for it to be known on the values of which data elements a specific calculation is dependent as early as when creating a control program for the arithmetic device. The dependencies of each results data record on the data elements is determined for the runtime. This is advantageous because the dependency of the results data record of a specific calculation step can change from the value of a specific data element as a function of the value of another data element. Additionally, it is particularly easy to use existing algorithms or program sections, which are used in calculation steps in the inventive method, since there is no need for a detailed analysis of the calculation with regard to its dependencies.

In principle, dependency and results data records for a plurality of ascertainment passes can be stored in the inventive method. In this case there are multiple results data records, and dependency data records are allocated to the results data records, respectively. If the values of the data elements, which are identified by one of the dependency data records, at the instant at which the dependency data record was ascertained, match the current values of these data elements, then the results data record allocated to this dependency data record can be provided as the calculation result.

Preferably, exactly one results data record and exactly one dependency data record are stored in the inventive method for a respective calculation step. If the results data record is recalculated in this calculation step, a previously ascertained results data record and dependency data record can be overwritten. In this case the inventive method also avoids unnecessary repetitions of calculations, for which correct results data records already exist, but at the same time the development of large databases and searching in a number of results and dependency data records is avoided.

If a results data record is ascertained for a calculation step, then a dependency data record allocated to the results data record is provided in the inventive method. For this purpose, it is possible, in the calculation step, to access values of the data elements of the input data record by reading an abstraction layer, and the dependency data record is ascertained by the abstraction layer as a function of the accesses to the data elements during the respective calculation step. The abstraction layer can provide a "proxy" function for access to the data elements. Instead of directly accessing a data element or a function, which returns the value of the data element, in a calculation step, access to a function of the abstraction layer may occur.

The function of the abstraction layer is first to provide the value of the data element. The abstraction layer may access a copy of the input data record. Access is made by the abstraction layer to the input data record itself, however, or to functions which return the values of data elements of the input data record. In addition, the function of the abstraction layer stores the fact that a read access was made to the value of the corresponding data element. It is possible for each access to the data element to be logged although advantageously only a first access to the respective data element is detected during a calculation step.

All read accesses to values of the data elements during the calculation step are detected by the abstraction layer and information about these accesses is provided as the dependency data record. The dependency data record can have numerous different formats in the inventive method. By way of example, it is possible for the dependency data record to form a bit mask which provides a binary value for each data element which is set to one or zero as a function of whether a calculation step is dependent on the value of the corresponding data element. Of course, any other data structure may also be used that reproduces the dependencies of the respective calculation step of the values of the data elements of the input data record.

It advantageous for a reference to a function allocated to the respective data element or a variable allocated to the respective data element to be stored in the dependency data record for each data element, on whose value the associated results data record is dependent, in order to describe the dependency. The value of the respective referenced variable, or the return value of the respective referenced function, is specified as a function of whether the value of the respective data element has changed with respect to the calculation step in which the dependency data record was ascertained. When using a dependency data record of this kind in the inventive method, advantageously only one function or variable then has to be provided for each of the data elements, which can indicate a change at the corresponding data element.

The dependency data record can be a list of references, such as pointers. If it is ascertained, for example by using the abstraction layer, that a calculation step is dependent on the value of a specific data element, the dependency data record, i.e. the list, is supplemented by a reference to a corresponding function or variable. For example, at the beginning of each calculation step, one empty list can be provided on an abstraction layer and the abstraction layer can add a corresponding reference to this list with each ascertained dependency.

A list-type function of the dependency data record can be implemented in various ways. For example, the dependency data record can be an array, in particular with a pointer to the last element, a linked list, a list of key value pairs or the like.

Write accesses to the input data record can be performed via the abstraction layer or a further abstraction layer. Via the abstraction layer or the further abstraction layer, the variable allocated to the respective data element or a parameter, on which the return value of the function allocated to the respective data element depends, can be set to a specified value in the case of a write access in order to change the value of one of the data elements. Data elements, whose value has been changed, are therefore marked by setting a variable or a parameter. At specified times the corresponding variables or values can be re-set, so these values can be marked as not-changed since the last calculation. This re-setting of the variables or parameters can occur, for example, on conclusion of a complete ascertainment pass.

Alternatively one storage element can be individually allocated to the function allocated to the data element, wherein at specified instants the value of the data element, or a value derived from this value, is stored in the storage element, and wherein when the function is invoked in the case where the value of the storage element does not match the value of the data element, a first return value is returned which shows a change in the value of the data element, and otherwise a second return value is returned which describes a constant value of the data element. In this case storing the value of the data element, or the value derived therefrom, in the storage element corresponds to a re-setting of the monitoring of the data element, i.e. from this instant the data element is regarded as unchanged up to the next change in its value. The specified instant can in particular be a respective instant following the conclusion of each ascertainment pass.

Alternatively it is possible to additionally store the value of the data element, or the value derived therefrom, in the storage element with each output of the first return value. After each change in the value of the data element the function would therefore return on its first invoking that the value of the data element has changed, and on a further invoking that the value of the data element has not changed. Monitoring of the data element is automatically re-set with this approach. This form of monitoring can only be used, however, if exactly one calculation step depends on the data element.

As explained, the dependency data record can store references to the variables or functions allocated to the respective data element in order to describe the dependency. The reference can be ascertained in particular as a function of an allocation data record which stores pairs of data elements and functions or variables allocated to the data elements. The allocation data record therefore provides a registry of functions or variables which are each used for monitoring one of the data elements for changes. This kind of registry of functions or variables makes it particularly easily possible to automatically generate functions or variables which can be registered in the dependency data record. In particular, corresponding variables or functions can be generated by a precompiler or dynamically for the runtime. Type information for return values of functions or for variables may also be stored in the allocation data record in order to achieve a reliable type allocation despite the use of references or pointers.

The invention also concerns a magnetic resonance apparatus that is designed to execute the inventive method. A correspondingly designed magnetic resonance apparatus enables particularly fast provision or checking of measuring sequences.

BRIEF DESCRIPTION OF THE DRAWINGS

FIG. 1 is a flowchart of an exemplary embodiment of the inventive method.

FIG. 2 illustrates an interaction between a program segment of a calculation step, an input data record and an abstraction layer in a further exemplary embodiment of the inventive method.

FIG. 3 shows an inventive magnetic resonance apparatus.

DESCRIPTION OF THE PREFERRED EMBODIMENTS

FIG. 1 is a flowchart of a method for operating a magnetic resonance apparatus, in which a measuring sequence is provided and checked by an arithmetic device before using the measuring sequence, i.e. before the activation of further components of the magnetic resonance device as a function of the measuring frequency. For reasons of clarity only one individual calculation step of the provision and checking of the measuring sequence is shown and explained in detail. Further calculation steps are performed accordingly.

In step S1, an input data record is specified or varied. This input data record may be, for example, a measuring protocol, which parameterizes a measuring sequence, which a user has selected from a list of a number of predetermined measuring protocols, and for which individual parameters are to be adjusted, such as a slice number or a resolution. In the following steps the parameters are adjusted by the arithmetic device such that an executable measuring sequence for data acquisition is generated and the resulting measuring sequence is checked. A number of ascertainment passes occur in which the measuring sequence is provided and checked. For example, a provided measuring sequence can be re-adjusted by a user, a measuring sequence can be iteratively optimized, or partial sequences of the measuring sequence can each be provided and checked in individual ascertainment passes. In the second and further ascertainment pass(es) the previously provided and checked measuring sequences are modified in step S1 and used as a new input data record.

Steps S2 to S13 together form one calculation step which is performed as part of the provision and checking of the measuring sequence. With a method for operating a magnetic resonance device according to the prior art, only step S4 would be provided, in which a calculation result is calculated and provided as a function of the values of individual data elements of the input data record. To avoid unnecessary repetitions of calculations the further steps S2 to S14 are provided in the inventive method, which provide and re-use calculation results already calculated as the results data record for this calculation step if no value of the data elements has changed on which the results data record depends.

An implementation of the disclosed method can proceed, for example, such that an invoking of a calculation step is replaced by a macro or a function call by which the function or the functions explained in more detail below are provided. This macro or the invoked function can implement steps S2, S3 and S7 to S13 in particular, and invoke the calculation function itself, and this is processed in step S4. Steps S5 and S6 are performed in an abstraction layer.

In step S2 it is first checked whether a dependency data record from a preceding ascertainment process exists for the calculation step. If this is not the case, then the values are initially not known on which the data elements of the input data record of the calculation currently being performed depend, and the method continues with step S3.

A potential dependency data record is discarded in step S3. This is necessary since step S3 can also be achieved on other execution paths. Furthermore, an empty list is provided on the abstraction layer, which, as explained below, is processed further by the abstraction layer to give a dependency data record.

The computing operations of the current calculation step are then performed in step S4. The computing operations depend on one value or a number of values of the data elements of the input data record. As part of the provision and checking of the measuring sequences for magnetic resonance apparatuses, a large number of different calculations are performed, which shall not be explained in detail herein. It is essential for the disclosed method that the performed calculations depend only on the input data record. Use of an abstraction layer between the calculation in step S4 and the input data record can therefore be implemented. Alternatively the calculations in step S4 could also depend on a number of input data records, for which a shared abstraction layer or a number of abstraction layers may be provided.

The calculations in step S4 do not directly access the data elements of the input data record in order to ascertain their respective values and to use them in the calculation. Instead, with each use of the value of a data element, a function of the abstraction layer is invoked that maps the value of the corresponding data element. This process is shown as steps S5 and S6.

Invoking of the function of the abstraction layer includes the information regarding which of the data elements should be read. In step S5, which is executed by the function of the abstraction layer, it is first detected that the calculation performed in step S4 is dependent on the data element whose value is being requested. For this purpose, reference to a function allocated to the corresponding data element is read from an allocation data record, the return value of which function, when the function is invoked, in each case indicating whether the value of the corresponding data element has changed since the calculation step in which the dependency data record was ascertained. Use of the corresponding functions will be explained later with reference to step S8 to step S12. The reference is appended as the last element to the dependency data record previously ascertained for the calculation step. On a first request for the value of a data element the dependency data record is an empty list and the reference is entered in this list as a first element.

In step S6 the value of the data element is then read from the input data record and provided for the calculation in step S4. The data element is read by a further function call, which invokes, for example, a function that is allocated to a class that includes the input data record.

Steps S5 and S6 are performed for each value of a data element that is used in the calculation performed in step S4.

In step S7 the calculation result provided in step S4 is stored as the results data record and the associated dependency data record formed by adding references in step S5 is stored. Storage associated with the calculation step occurs in a list of key value pairs. Alternatively it would be possible, for example, to map individual calculation steps in individual classes to which storage options for the results data record and the dependency data record respectively are allocated.

The method then continues with step S14, as explained below.

If it was ascertained in step S2 that there is a dependency data record from the corresponding calculation step of a preceding ascertainment pass, the method continues with step S8 in which the dependency data record associated with the calculation step is read.

As explained in relation to step S5, the dependency data record is a list of references to functions. In step S9 the first of these functions is invoked by resolving the reference. The execution of the function is illustrated as step S10. A storage element is allocated to the function, in which element a value of the data element allocated to the function can be stored. The instantaneous values of the data element are each stored in the storage element in step S15. The function compares the value stored in the storage element with the instantaneous value of the data element and, if these two values differ, returns a first return value that indicates a change in the value of the data element, and otherwise returns a different second return value that designates an unchanged status of the value of the data element.

Step S11 evaluates the return value of the function. The method continues with step S3 if the first return value was returned by the function, in other words, the data element has changed. In this case the calculation is performed as already explained. If, however, the second return value was returned, in other words, the data element has not changed, the method continues with step S12.

In step S12 it is checked whether the list of function references has already been processed in the dependency data record, i.e. whether each of the referenced functions has already been invoked. If this is not the case, the method continues with step S9, wherein in step S9 the next of the functions that has not yet been invoked is invoked.

If all of the functions referenced by the dependency data record have been processed and yet there was still no branching to step S3 in step S11, the values of all data elements, on which the instantaneous calculation step depends, are unchanged compared to the step in which the dependency data record was ascertained. The results data record allocated to the dependency data record can accordingly be provided in step S13 as the calculation result.

Further calculation steps are performed in step S14, wherein the sequence of the calculation steps in step S14 in each case matches the sequence of the first calculation step, which was described with reference to steps S2 to S13.

In step S15 all data elements are marked as being unchanged. For this purpose the storage elements of the functions allocated to data elements are each set to the value of the corresponding data elements. This is possible since in step S15 all results data records, which depend on values of the data elements which had changed, were recalculated, whereby calculation results exist which correspond to the actual contents of the data elements. The instantaneous state of the data elements is therefore a new initial state. It is possible to mark all of the data elements as unchanged in step S15 in the disclosed method since there are no write accesses to the data elements of the input data record within the calculation steps. If in a development of the disclosed method write accesses to data elements should also be possible within calculation steps, then, as explained below with reference to FIG. 2, an abstraction layer may be provided for write accesses. As a result, data elements to which write accesses have been made are marked and these data elements are not marked as unchanged in step S15.

It is checked in step S16 whether the provision and checking of the measuring sequence has finished. For example, the previously calculated measuring sequence can be displayed to a user who can introduce further changes or it can be checked whether certain conditions, such as a convergence of a parameter, are met. If further ascertainment passes are to be carried out the method continues from step S1. In other cases the method continues with step S17 in which the measuring sequence is used to activate components of the magnetic resonance device in order to acquire measuring data.

FIG. 2 schematically shows the interaction between a program segment 1, which performs a calculation step for the provision and checking of a measuring sequence in an alternative exemplary embodiment of the method, an abstraction layer 2 and an input data record 3. The input data record 3 can in particular be in the form of an object instance which, in addition to the data elements 4, includes functions with which a read or write access is made to the data elements 4. In the disclosed method it is not necessarily known from the start on which of the data elements 4 the calculations in program segment 1 depend. To ascertain this dependency for the runtime, a dependency data record 5 is generated by the abstraction layer 2. At the start of the program segment 1 the dependency data record 5 is deleted by the program segment 1, i.e. the dependency data record corresponds to an empty list.

As part of program segment 1, calculations are performed that depend on the values of the data elements 4. The program segment 1 does not directly access the data elements 4 or functions which provide the values thereof, and instead invokes a function 6 of the abstraction layer 2 in order to read the value of the data element 4. The function 6 of the abstraction layer 2 reads, in particular indirectly via a function of a corresponding object instance, the value of the data element 4 and provides it on the program segment 1. In addition, the function 6 registers the dependency of the program segment 1 in the dependency data record 5. A reference to a variable 8 is allocated to the data element 4 via a key value list, the allocation data record 7, which reference registers changes on the corresponding data element 4.

To register changes on one of the data elements 4 the abstraction layer 2 also monitors write accesses by the program segment 1 to the data elements 4 of the input data record 3. If a write access to a data element 4 should occur by the program segment 1, the program segment 1 then invokes a function 9 of the abstraction layer 2. This firstly performs the write access to the data element 4 in order to change the value of the data element 4. Secondly, the function 9 sets a variable 8, which is allocated to the data element 4, to a specified value in order to display a change in the data element 4.

FIG. 3 shows an inventive magnetic resonance scanner 10 of a magnetic resonance apparatus. The magnetic resonance scanner 10 has an examination volume 11 into which an examination object 12 is introduced. Coils (not shown) of the magnetic resonance scanner 10 for generating magnetic fields are activated by a controller 13 and data are acquired by receiving antennae (not shown). The components of the magnetic resonance scanner 10 are controlled as a function of a measuring sequence that is provided by the controller 13. The measuring sequence is provided and checked as explained in FIGS. 1 and 2.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for generating a measurement sequence in order to operate a magnetic resonance (MR) apparatus, the measurement sequence comprising a plurality of parameters that respectively activate a component of the MR apparatus, said method comprising:

providing said measurement sequence, represented as an input data record, to a processor, said input data record comprising parameter value respectively for each control parameter in said measurement sequence;

in said processor, reviewing said input data record in a plurality of successive ascertainment passes in order to obtain, in each ascertainment pass, a calculation result that involves at least one of said control parameters, with the parameter value of at least one of said parameters changing from one ascertainment pass to a next ascertainment pass in a manner that would change such calculation result if said parameter with the changed parameter value entered into the calculation;

in each of said ascertainment passes in said processor, performing a calculation step involving at least one of the parameters of the input data record so as to obtain said calculation result, and storing the calculation result in a results record of the respective calculation step;

for each results record, generating a dependency data record in the processor, wherein the dependency data record designates which of the data elements entered into the calculation step that produced the calculation result stored in the respective results record, and storing each dependency data record so as to be accessible by said processor in all subsequent ascertainment passes;

in said processor, performing the calculation step on a respective data element in a current ascertainment pass only if either, as a condition (1), there is no dependency data record for the respective calculation step from a previous ascertainment pass that can be accessed, or (2) after accessing the respective dependency data records for all previous ascertainment passes of successive ascertainment passes, and identifying, from the accessed dependency data records, that the respective data element of the current ascertainment pass entered into a previous results record and that the respective data element now has a different value in the current ascertainment pass, and if neither condition (1) or (2) exists, reusing said previous results record as the results record of the calculation step in the current ascertainment pass; and using the results record from a last-occurring one of said plurality of successive ascertainment passes to set the value of said at least one control parameter in said magnetic resonance sequence, and making the measurement sequence with the set control parameter available at an output of the processor in an electronic form configured to operate said MR apparatus.

2. A method as claimed in claim 1 comprising, in each calculation step, accessing respective values of the data elements of the input data record by reading an abstraction layer with the respective dependency data records being ascertained via the abstraction layer dependent on accesses made to the respective data elements during the respective calculation step.

3. A method as claimed in claim 1 comprising generating each dependency data record to include, for each data element that has a value involved in an associated results record, a mathematical designation selected from the group consisting of a function that describes a dependency of the respective control parameter on the calculation step, and a variable that describes a dependency of the respective control parameter on the calculation step.

4. A method as claimed in claim 3 comprising, in each calculation step, accessing respective values of the control parameters of the input data record by reading an abstraction layer with the respective dependency data records being ascertained via the abstraction layer dependent on accesses made to the respective control parameters during the respective calculation step, and performing write access to said input data record via said abstraction layer or via a further abstraction layer wherein the variable allocated to the respective control parameter is set to a predetermined value during said write access, in order to change the value of the respective control parameter.

5. A method as claimed in claim 3 comprising allocating one storage element to a function of the control parameter and, at predetermined points in time, storing the value of the control parameter, or a value derived therefrom, in a storage medium, and, when invoking the function when a value of the control parameter in the storage medium does not match the value of a control parameter in the input data record, returning a first return value that indicates said change, and otherwise returning a second return value that designates a constant value of the respective control parameter.

6. A method as claimed in claim 3 comprising determining said reference as a function of an allocation data record wherein pairs of control parameters and functions, or variables allocated to the control parameters, are stored.

7. A magnetic resonance (MR) apparatus comprising:

an MR scanner comprising a plurality of components that are configured to operate according to a measurement sequence, said measurement sequence comprising a plurality of parameters that respectively activate at least one respective component of the MR scanner;

a processor provided with said measurement sequence, represented as an input data record said input data record comprising a parameter value respectively for each control parameter in said measurement sequence;

said processor being configured to automatically review said input data record in a plurality of successive ascertainment passes in order to obtain, in each ascertainment pass, a calculation result that involves at least one of said control parameters, with the parameter value of at least one of said parameters changing from one ascertainment pass to a next ascertainment pass in a manner that would change such calculation result if said parameter with the changed parameter value entered into the calculation;

in each of said ascertainment passes said processor being configured to perform a calculation step involving at least one of the parameters of the input data record so as to obtain said calculation result, and to store the calculation result in a results record of the respective calculation step;

said processor being configured, for each results record, to generate a dependency data record in the processor, wherein the dependency data record designates which of the data elements entered into the calculation step that produced the calculation result stored in the respective results record, and to store each dependency data record so as to be accessible by said processor in all subsequent ascertainment passes;

said processor being configured to perform the calculation step on a respective data element in a current ascertainment pass only if either, as condition (1), there is no dependency data record for the respective calculation step from a previous ascertainment pass that can be assessed, or, as condition (2), after accessing the respective dependency data records for all previous ascertainment passes, and to identify, from the accessed dependency data records, that the respective data element of the current ascertainment pass entered into a previous results record, and that the respective data element now has a different value in the current ascertainment pass, and if neither condition (1) or (2) exists, reusing said previous results record as the results record of the calculation step in the current ascertainment pass; and said processor being configured to use the results record from a last-occurring one of said plurality of successive ascertainment passes to set said at least one control parameter in said magnetic resonance sequence, and to make the measurement sequence with the set control parameter available at an output of the processor in an electronic form configured to operate said MR apparatus.

* * * * *